United States Patent
Anderson et al.

(10) Patent No.: US 9,520,391 B1
(45) Date of Patent: Dec. 13, 2016

(54) FIELD EFFECT TRANSISTOR HAVING DELAY ELEMENT WITH BACK GATE

(71) Applicant: GLOBALFOUNDRIES INC., Grand Cayman (KY)

(72) Inventors: Brent A. Anderson, Jericho, VT (US); Terence B. Hook, Jericho Center, VT (US); Myung-Hee Na, Lagrangeville, NY (US); Edward J. Nowak, Shelburne, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/996,371

(22) Filed: Jan. 15, 2016

(51) Int. Cl.
*H01L 27/06* (2006.01)
*H01L 29/786* (2006.01)
*H01L 21/8238* (2006.01)

(52) U.S. Cl.
CPC ... *H01L 27/0629* (2013.01); *H01L 21/823842* (2013.01); *H01L 21/823857* (2013.01); *H01L 29/78648* (2013.01)

(58) Field of Classification Search
None
See application file for complete search history.

(56) References Cited

U.S. PATENT DOCUMENTS

| | | | |
|---|---|---|---|
| 5,942,781 A | 8/1999 | Burr et al. | |
| 5,999,043 A | 12/1999 | Zhang et al. | |
| 6,100,567 A | 8/2000 | Burr | |
| 6,423,599 B1 | 7/2002 | Yu | |
| 6,911,701 B2 | 6/2005 | Arima | |
| 7,335,932 B2 | 2/2008 | Anderson et al. | |
| 2012/0153373 A1 | 6/2012 | Chen | |
| 2013/0140612 A1 | 6/2013 | Sun et al. | |

FOREIGN PATENT DOCUMENTS

JP    11-307652 A   *  11/1999

OTHER PUBLICATIONS

Wolf, Stanley, Silicon Processing for the VLSI Era, vol. 2: Process Integration, Lattice Press: Sunset Beach CA, 1990, pp. 298, 299, 368, 369.*

* cited by examiner

*Primary Examiner* — Erik Kielin
(74) *Attorney, Agent, or Firm* — Gibb & Riley, LLC; Michael J. LeStrange, Esq.

(57) ABSTRACT

Methods form complementary metal oxide semiconductor (CMOS) devices that include a first transistor and a complementary second transistor, and an output connected to the first transistor and the second transistor. The first transistor includes a first channel region, a first back gate, a first delay element between the output and the first back gate, and a first back gate insulator separating the first back gate from the first channel region. The second transistor includes a second channel region, a second back gate, a second delay element between the output and the second back gate, and a second back gate insulator separating the second back gate from the second channel region. The first delay element, the first back gate insulator, and the first channel region form a first resistor-capacitor (RC) circuit, and the second delay element, the second back gate insulator, and the second channel region form a second RC circuit.

20 Claims, 10 Drawing Sheets

FIELD EFFECT TRANSISTOR HAVING DELAY ELEMENT WITH BACK GATE

BACKGROUND

The present disclosure relates to methods for making field effect transistor devices and the resulting devices, and more specifically, to using delay elements with the back gate of such devices to reduce active power consumption.

Complementary metal oxide semiconductor (CMOS) logic dissipates less power than other logic circuits because CMOS dissipates power primarily only when switching ("dynamic power"). CMOS circuits are constructed in such a way that at least one P-type transistor and at least one N-type transistor are in series in any circuit path connecting relatively higher voltage (Vdd) to relatively lower voltage (Vss), and furthermore, at least one such N-type transistor or at least one P-type transistor in this path will have high resistance when not switching.

The composition of a P-type metal oxide semiconductor (PMOS) transistor creates low resistance between its source and drain contacts when a low gate voltage is applied and high resistance when a high gate voltage is applied. On the other hand, the composition of an N-type metal oxide semiconductor (NMOS) transistor creates high resistance between source and drain when a low gate voltage is applied and low resistance when a high gate voltage is applied.

CMOS circuits connect the drains and gates of the PMOS and NMOS transistors, typically connect the source of the PMOS to Vdd, and typically connect the source of the NMOS to Vss. Therefore, when the voltage of input (A) is low, the NMOS transistor's channel is off (in a high resistance state) preventing current flow from the output (Q) to ground; however, the PMOS transistor's channel is on (in a low resistance state) and current can flow from the Vdd to the output Q, and this causes the output Q to have high voltage (Vdd), the opposite of the input A. When the voltage of input A is high, the PMOS transistor is off, so no current flows from the Vdd to the output Q; however, the NMOS transistor is on, allowing the output to connect to ground Vss (again the inverse of the input A).

Therefore, CMOS accomplishes current reduction by complementing every N-type metal oxide semiconductor field effect transistor (nMOSFET) with a P-type metal oxide semiconductor field effect transistor (pMOSFET) and connecting both gates and both drains together. A high voltage on the gates will cause the nMOSFET to conduct and the pMOSFET to not conduct, while a low voltage on the gates causes the reverse.

SUMMARY

Exemplary structures herein include complementary metal oxide semiconductor (CMOS) device that have, among other components a first transistor having a first polarity, a second transistor having a second (opposite) polarity, an input connected to the first transistor and the second transistor, and an output connected to the first transistor and the second transistor.

More specifically, the first transistor includes a first channel region made of a semiconductor, and a first gate conductor and a first back gate separated by the first channel region. The first transistor further includes a first gate insulator separating the first gate conductor from the first channel region. The first gate insulator is thinner than the first back gate insulator (in a "first" direction from the first gate conductor to the first back gate). The second transistor further includes a second gate insulator separating the second gate conductor from the second channel region. The second gate insulator is also thinner than the second back gate insulator in the first direction.

Also, these structures include a first delay element between the output and the first back gate. Further, a first back gate insulator separates the first back gate from the first channel region, and a first source and a first drain are separated by the first channel region. Similarly, the second transistor includes a second channel region made of a semiconductor, and a second gate conductor and a second back gate separated by the second channel region. Also, these structures include a second delay element between the output and the second back gate. Further, a second back gate insulator separates the second back gate from the second channel region, and a second source and a second drain are separated by the second channel region. In such structures, the first gate conductor and the second gate conductor are connected to the input, and the first drain and the second drain are connected to the output (the first source, first drain, second source, and second drain are all conductors).

The first delay element, the first back gate insulator, and the first channel region may be a first resistor-capacitor (RC) circuit; and, similarly, the second delay element, the second back gate insulator, and the second channel region may be a second RC circuit. The first delay element is a relative "resistor" to the other components, and is therefore more conductive than the first back gate insulator and less conductive that the first back gate, and the same applies to the second delay element, which is more conductive than the second back gate insulator and less conductive that the second back gate. The first and second RC circuits delay changes in threshold voltage of the first and second transistors, and such changes (e.g., decreases and increases) in threshold voltage occur when the voltage of the first back gate and/or the second back gate changes. The changes in threshold voltage of the second transistor are decreases in threshold voltage, and the changes in threshold voltage of the first transistor are increases in threshold voltage.

Exemplary methods herein are used to make such CMOS devices. Note, that many of the steps detailed below can be performed in different orders, depending upon the type of transistor device being made (e.g., horizontal vs. planar transistors, etc.). Such methods simultaneously form a first transistor having a first polarity and a second transistor having a second polarity, opposite the first polarity.

Such processing can include, among other steps, forming a first channel region that includes a first polarity semiconductor and forming a second channel region that includes a second polarity semiconductor. These methods form a first source and a first drain contacting the first channel region, and similarly form a second source and a second drain contacting the second channel region.

These methods also form a first gate insulator that will separate the first gate conductor from the first channel region. The first gate insulator is thinner than the first back gate insulator (in the first direction, that is from the first gate conductor to the first back gate). The second transistor further includes a second gate insulator that will separate the second gate conductor from the second channel region. The second gate insulator is similarly thinner than the second back gate insulator in the first direction. Also, these methods form a first gate conductor adjacent the first channel region (on the first gate insulator), and form a second gate conductor adjacent the second channel region (on the second gate insulator).

Such methods further form a first back gate insulator contacting the first channel region, form a second back gate insulator contacting the second channel region, form a first back gate contacting the first back gate insulator (the first back gate is separated from the first channel region by the first back gate insulator), and form a second back gate contacting the second back gate insulator (similarly, the second back gate is separated from the second channel region by the second back gate insulator).

These methods additionally form a first delay element connected to the first back gate, and form a second delay element connected to the second back gate. Further, such processing forms an input connected to the first gate conductor and the second gate conductor, and forms an output connected to the first drain and the second drain. The first resistor, the first back gate insulator, and the first channel region may be formed to create a first resistor-capacitor (RC) circuit; and, similarly, the second resistor, the second back gate insulator, and the second channel region may be formed to create a second RC circuit. The first delay element is a relative "resistor" and is therefore more conductive than the first back gate insulator and less conductive that the first back gate, and the same applies to the second resistor, which is more conductive than the second back gate insulator and less conductive that the second back gate. The first and second RC circuits delay changes in threshold voltage of the first and second transistors, and such changes (e.g., decreases and increases) in threshold voltage occur when a voltage of the first back gate and/or the second back gate changes. The changes in threshold voltage of the second transistor are decreases in threshold voltage, and the changes in threshold voltage of the first transistor are increases in threshold voltage.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, CMOS accomplishes current reduction by complementing every N-type metal oxide semiconductor field effect transistor with a P-type metal oxide semiconductor field effect transistor, and connecting both gates and both drains together. This arrangement greatly reduces power consumption and heat generation; however, during the switching time, both MOSFETs conduct briefly as the gate voltage goes from one state to another. This induces a brief spike in power consumption, which is relevant especially at high frequencies. Since there is a finite rise/fall time for both the PMOS and NMOS transistors, during transition, both the transistors will be on for a small period of time in which current will find a path directly from Vdd to ground, hence creating a short-circuit current. Short-circuit power dissipation increases with increasing input-voltage rise and fall time of the transistors.

Therefore, in traditional CMOS circuits, there is a fraction of wasted power due to 'short-circuit' (SC) or 'shoot-through current'. This current is due to charge that flows from Vdd directly through pFET(s) and nFET(s) to ground during switching (during the period where the input gate is above threshold voltages of both pFET and nFET simultaneously). As the threshold voltage (Vt) is lowered to provide very high speed, this switching charge is robbed from the output load, resulting in added propagation delay, and shows up as excess power. One solution is to reduce Vdd, or increase Vt; however, both of these actions increase circuit delay.

In view of this, the methods and devices herein provide a structure that substantially reduces the shoot-through current (STC) for low-Vt, high-Vdd operation, and therefore such devices are particularly well suited for very high-speed single-thread performance.

Figure 1:
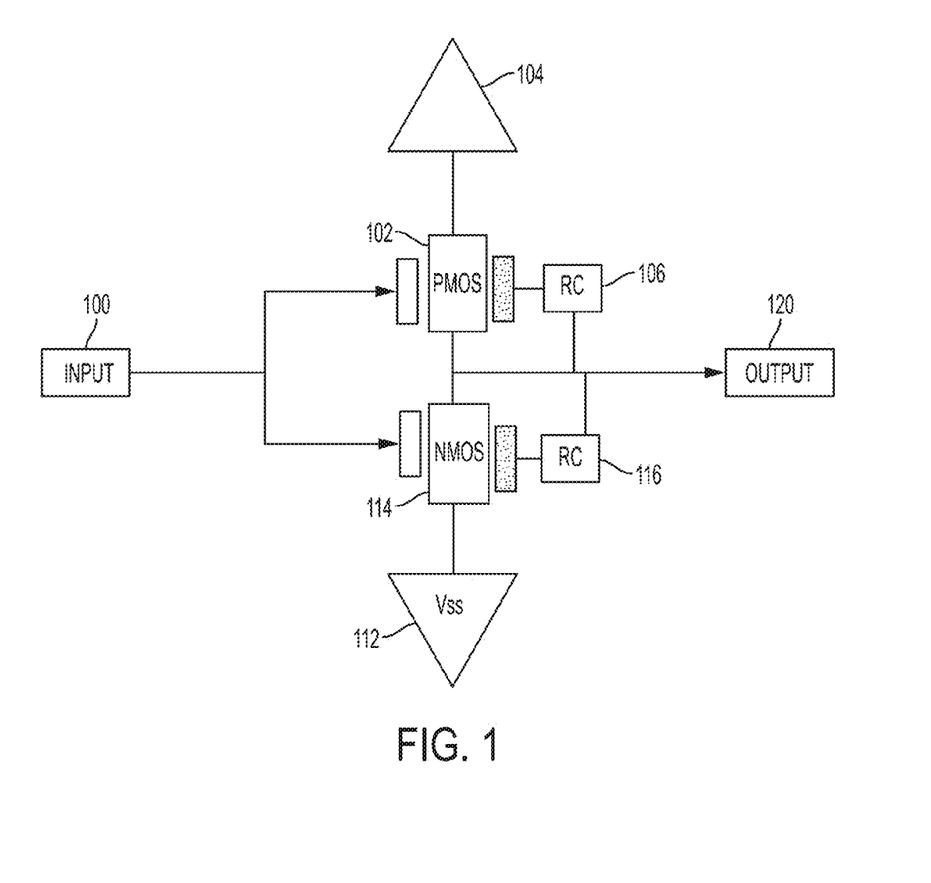
FIG. 1 is a schematic diagram illustrating CMOS devices herein.

The methods and structures described herein provide complementary metal oxide semiconductor (CMOS) devices, such as that shown in FIG. 1. These devices include a first transistor 102 (PMOS) and a complementary second transistor 114 (NMOS), and an input 100 and an output 120 connected to the first transistor 102 and the second transistor 114. Further, depending on the voltage level of the input 100 signal, either a relatively higher operating voltage (Vdd) 104 is supplied to the output 120 through the first transistor 102, or the output 120 is connected to a relatively lower voltage (e.g., ground or Vss) 112 through the second transistor 114.

The structure includes a first delay element 106 capacitively and resistively coupled to the output 120 and the first transistor 102, and similarly a second delay element 116 is capacitively and resistively coupled to the output 120 and the second transistor 114. The first delay element 106 may be a first resistor-capacitor (RC) circuit, and the second delay element 116, may be a second RC circuit. The first and second RC circuits delay changes (e.g., decreases and increases) in threshold voltage of the first and second transistors 102, 114, and such changes in threshold voltage occur when the voltage of the first back gate and/or the second back gate changes. The changes in threshold voltage of the second transistor 114 are decreases in threshold voltage, and the changes in threshold voltage of the first transistor 102 are increases in threshold voltage.

More specific exemplary structures herein are shown in FIGS. 2-5, and while some simplified transistor structures are illustrated, those ordinarily skilled in the art would understand that the structures herein include all forms of transistors, whether currently known or developed in the future (as supported by generic FIG. 1). Therefore, the following are examples, and are not intended to limit the structure of the devices herein.

Figure 2:
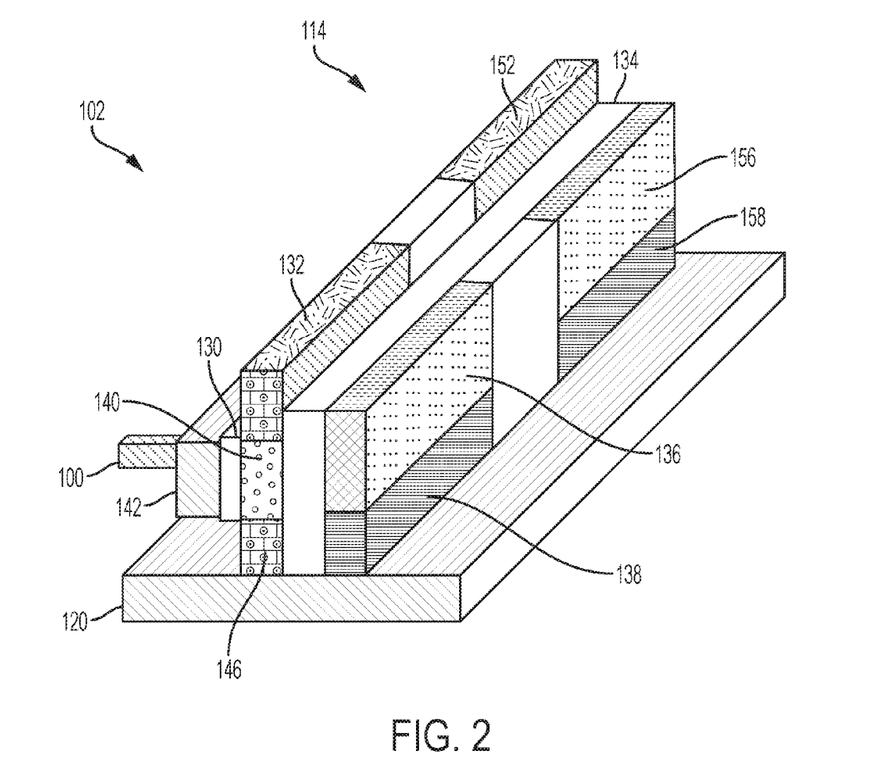
FIG. 2 is a perspective view schematic diagram illustrating CMOS devices herein.
Figure 3:
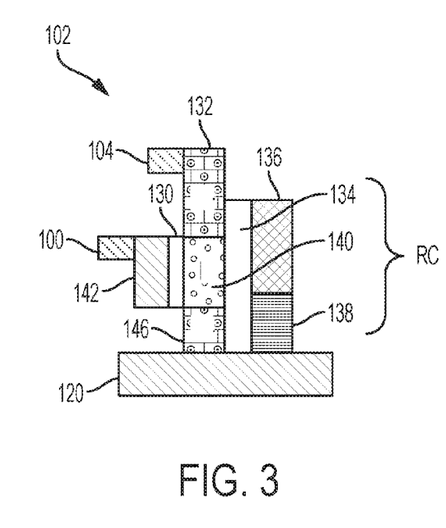
FIGS. 3-5 are cross-sectional view schematic diagrams illustrating CMOS devices herein.
Figure 4:
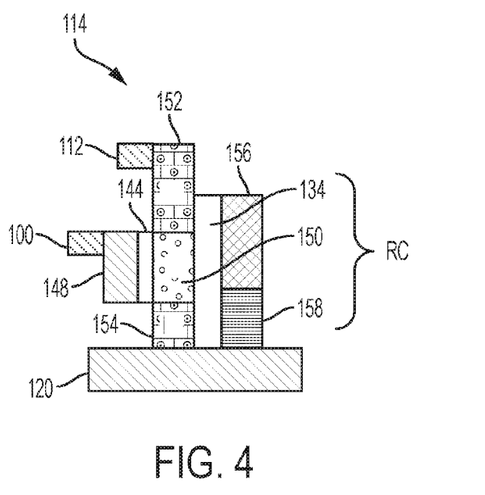

FIGS. 2-4 illustrate vertical transistor CMOS devices that have, among other components a first transistor 102 having a first polarity, a second transistor 114 having a second (opposite) polarity, an input 100 connected to the first transistor 102 and the second transistor 114, and an output 120 connected to the first transistor 102 and the second transistor 114.

More specifically, as shown in FIGS. 2-4, the first transistor 102 can include a first channel region 140 made of a semiconductor and the second transistor 114 can include a second channel region 150 made of a semiconductor. As shown, this structure also includes a first gate conductor 142 and a first back gate 136 separated by the first channel region 140 (thus, the first channel region 140 is between the first gate conductor 142 and the first back gate 136), and similarly includes a second gate conductor 148 and a second back gate 156 separated by the second channel region 150 (thus, the second channel region 150 is between the second gate conductor 148 and the second back gate 156).

The first transistor 102 further includes a first gate insulator 130 separating the first gate conductor 142 from the first channel region 140 (thus, the first gate insulator 130 is between the first gate conductor 142 and the first channel region 140); and similarly, the second transistor 114 includes a second gate insulator 144 separating the second gate conductor 148 from the second channel region 150 (thus, the second gate insulator 144 is between the second gate conductor 148 and the second channel region 150). As shown, the first and second gate insulators 130, 144 are thinner (e.g., 15% of the thickness, 10% of the thickness, 5% of the thickness) relative to the first and second back gate insulators 134. For reference, this thickness is measured in a "first" direction that extends from the first gate conductor 142 to the first back gate 136.

Further, a first back gate insulator 134 separates the first back gate 136 from the first channel region 140 (the first back gate insulator 134 is between the first back gate 136 and the first channel region 140), and a first source 132 and a first drain 146 are separated by the first channel region 140 (the first channel region 140 is between the first source region 132 and the first drain region 146). Further, a second back gate insulator 134 separates the second back gate 156 from the second channel region 150 (the second back gate insulator 134 is between the second back gate 156 and the second channel region 150), and a second source 152 and a second drain 154 are separated by the second channel region 150 (the second channel region 150 is between the second source 152 and the second drain 154). Note, that while the back gate insulator 134 is shown as being continuous and shared between the first and second transistors 102, 114; separate back gate insulators could be used for the different transistors, depending upon the specific design of the transistors. Similarly, while the back gates 136, 156 are shown as being separate elements for the different transistors 102, 114; a continuous back gate could be utilized, again depending upon the specific design of the structure.

As shown in FIGS. 2-4, the first gate conductor 142 and the second gate conductor 148 are connected to the input 100, and the first drain 146 and the second drain 154 are connected to the output 120 (the first source 132, first drain 146, second source 152, and second drain 154 are all conductors).

Also, these structures include a first delay element 138 between the output 120 and the first back gate 136, and a second delay element 158 between the output 120 and the second back gate 156. The first delay element 138, the first back gate insulator 134, and the first channel region 140 may be a first resistor-capacitor (RC) circuit; and, similarly, the second delay element 158, the second back gate insulator 134, and the second channel region 150 may be a second RC circuit, as shown in FIGS. 3 and 4. The first and second RC circuits delay changes in threshold voltage of the first and second transistors 102, 114, and such changes (e.g., decreases and increases) in threshold voltage occur when the voltage of the first back gate 136 and/or the second back gate 156 changes. The changes in threshold voltage of the second transistor 114 are decreases in threshold voltage, and the changes in threshold voltage of the first transistor 102 are increases in threshold voltage.

Again, while the resistors 138, 158 are shown as being separate for the separate transistors 102, 114, a common, continuous, shared resistor could be utilized for the transistors depending upon the specific design utilized. In addition, while the resistors 138, 158 are shown as contacting the back gates 136, 156, the resistors 138, 158 could be located in many different positions depending upon the specific transistor design utilized. The first delay element 138 is a relative "resistor" to the other components, and is therefore more conductive than the first back gate insulator 134 and less conductive that the first back gate 136, and the same applies to the second delay element 158, which is more conductive than the second back gate insulator 134 and less conductive that the second back gate 156. The delay elements have structure (such as resistors, etc.) that cause the input voltage to be transmitted to the back gates substantially after the input voltage change occurs, and this structure causes the delay time to be greater than the input voltage rise or fall time (where rise or fall time is the time required for the input voltage to change from 10% to 90% of Vdd-Vss, or vice versa). Also this structure causes the delay time to be less than the cycle time (that time between repeated switching of the circuit). Typically, the delay would be greater than twice the rise/fall input time, and ten-times this value. Specifically, in the case where the delay element includes a resistor of value R, this delay time is approximately equal to R multiplied by the capacitance of the back gate. In other words, the first delay element 138 delays an input voltage being transmitted from the first gate conductor 142 to the first back gate 136 by a time greater than the input voltage rise or fall time, and the second delay element 158 similarly delays an input voltage being transmitted from the second gate conductor 148 to the second back gate 156 by a time greater than the input voltage rise or fall time.

Figure 5:
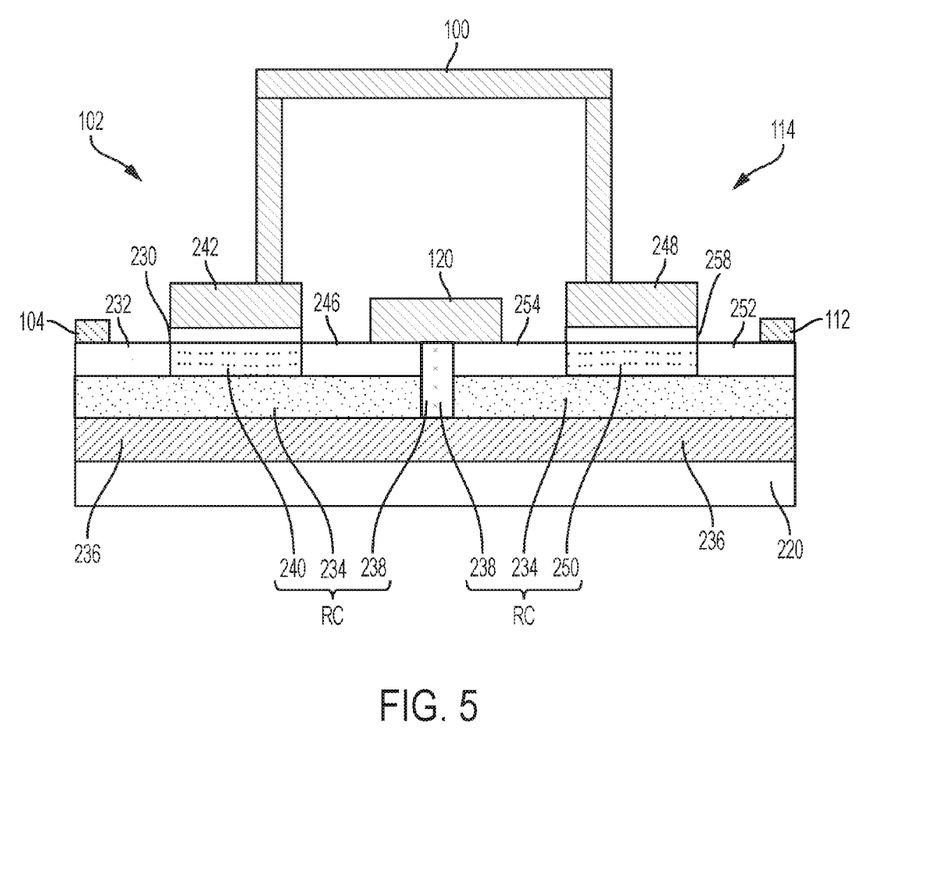

FIG. 5 illustrates horizontal transistor CMOS devices that have, among other components a first transistor 102 having a first polarity, a second transistor 114 having a second (opposite) polarity, an input 100 connected to the first transistor 102 and the second transistor 114, and an output 120 connected to the first transistor 102 and the second transistor 114.

More specifically, the first transistor 102 includes a first channel region 240 made of a semiconductor in a substrate 220, a first gate conductor 242, and a first back gate 236 separated by the first channel region 240. The first transistor 102 further includes a first gate insulator 230 separating the first gate conductor 242 from the first channel region 240. As noted above, the first gate insulator 230 is thinner (e.g., 15%, 10%, 5%, etc.) relative to the first back gate insulator 234 (in the "first" direction from the first gate conductor 242 to the first back gate 236). The second transistor 114 further includes a second gate insulator 258 separating the second gate conductor 248 from the second channel region 250. The second gate insulator 258 is similarly thinner than the second back gate insulator 234 in the first direction.

Further, a first back gate insulator 234 separates the first back gate 236 from the first channel region 240, and a first source 232 and a first drain 246 are separated by the first channel region 240. Similarly, the second transistor 114 includes a second channel region 250 made of a semiconductor and a second gate conductor 248, and a second back gate 236 separated by the second channel region 250. Further, a second back gate insulator 234 separates the second back gate 236 from the second channel region 250, and a second source 252 and a second drain 254 are separated by the second channel region 250. In such structures, the first gate conductor 242 and the second gate conductor 248 are connected to the input 100, and the first drain 246 and the second drain 254 are connected to the output 120 (the first source 232, first drain 246, second source 252, and second drain 254 are all conductors).

Also, these structures include a first delay element 238 between the output 120 and the first back gate 236, and a second delay element 238 between the output 120 and the second back gate 236. As noted above, and the resistor and back gate could be a shared (e.g., a common resistor 238 and a common back gate 236) and FIG. 5 and illustrates such an example. The first delay element 238, the first back gate insulator 234, and the first channel region 240 may be a first resistor-capacitor (RC) circuit; and, similarly, the second delay element 238, the second back gate insulator 234, and the second channel region 250 may be a second RC circuit.

Again, the first delay element 238 is a relative "resistor" to the other components, and is therefore more conductive than the first back gate insulator 234 and less conductive than the first back gate 236, and the same applies to the second delay element 238, which is more conductive than the second back gate insulator 234 and less conductive that the second back gate 236. The first and second RC circuits delay changes in threshold voltage of the first and second transistors 102, 114, and such changes (e.g., increases and decreases) in threshold voltage occur delayed by a short (about 2 to 100 times the inverter delay time) time span from when the voltage of the input 100 changes. It is understood by one skilled in the art that the back gates 236, can be electrically isolated from the substrate 220 by junction isolation, or other techniques. Thus, the changes in threshold voltage of the second transistor 114 are decreases in threshold voltage, and the changes in threshold voltage of the first transistor 102 are increases in threshold voltage. Again, the first delay element 238 delays an input voltage being transmitted from the first gate conductor 242 to the first back gate 236 by a time greater than the input voltage rise or fall time, and the second delay element 238 similarly delays an input voltage being transmitted from the second gate conductor 248 to the second back gate 236 by a time greater than the input voltage rise or fall time.

Figure 6:
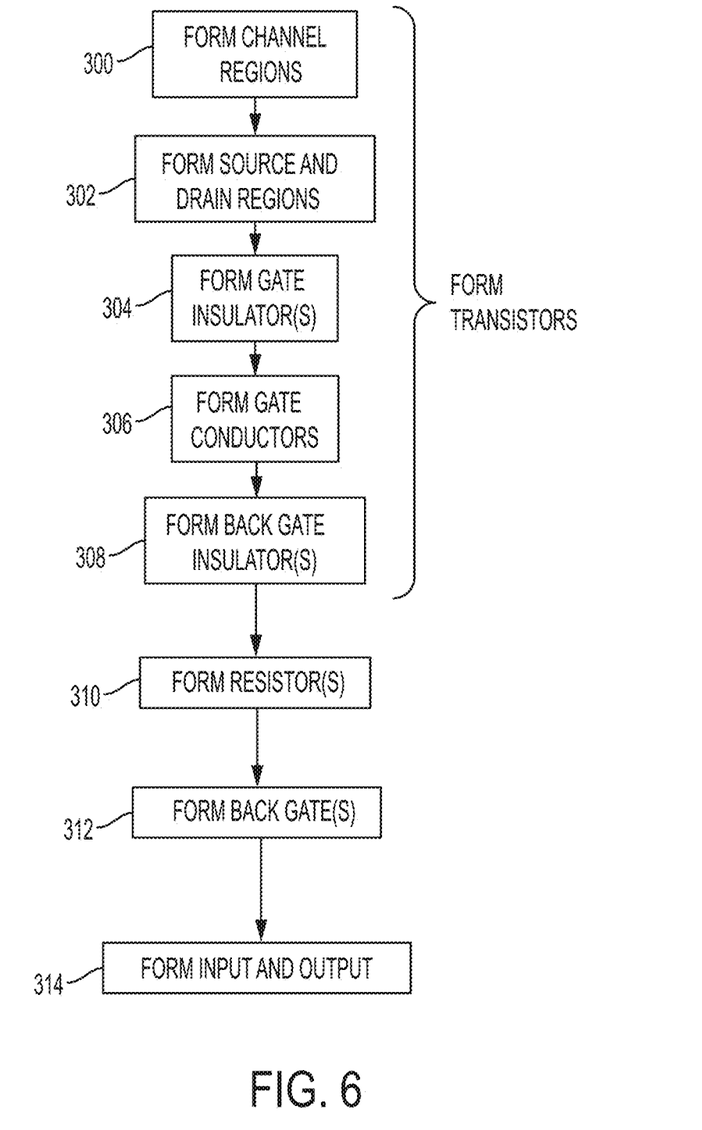
FIG. 6 is a flow diagram illustrating embodiments herein.

FIG. 6 is a flowchart showing exemplary methods herein, used to make such CMOS devices. While some simplified methods of making transistor structures are illustrated, those ordinarily skilled in the art would understand that the methods herein include all methods for making transistors, whether currently known or developed in the future (as supported by generic FIG. 6). Note, that many of the steps detailed below can be performed in different orders, depending upon the type of transistor device being made (e.g., horizontal vs. planar transistors, etc.) and that many other steps can be added to such processing.

Figure 7:
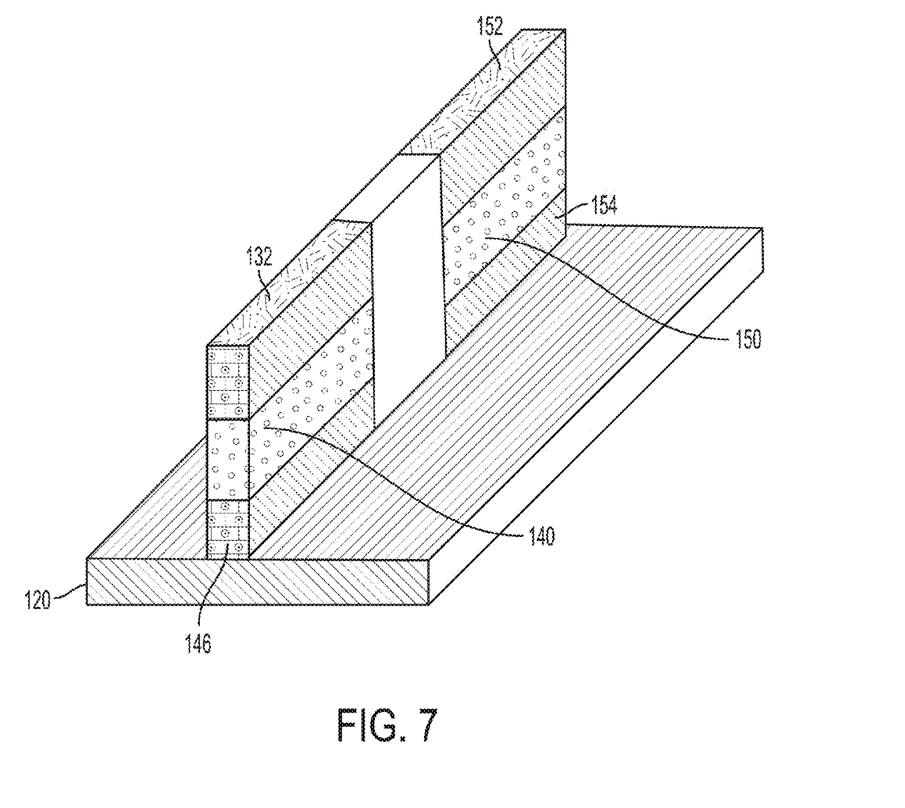
FIGS. 7-10 are perspective view schematic diagrams illustrating CMOS devices herein.
Figure 11:
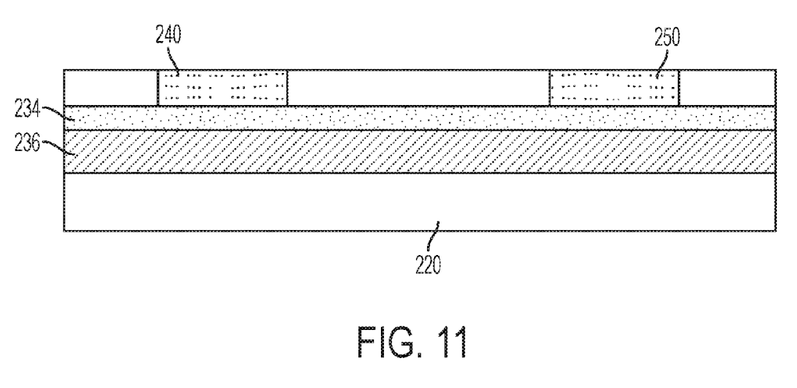
FIGS. 11-14 are cross-sectional view schematic diagrams illustrating CMOS devices herein.

In items 300-308, such methods simultaneously form a first transistor having a first polarity and a second transistor having a second polarity, opposite the first polarity. For example, such processing can include, as shown in item 300 in FIG. 6, forming a first channel region in a substrate 220 (shown in item 140 in FIG. 7 and item 240 in FIG. 11) that includes a first polarity semiconductor and forming a second channel region (shown in item 150 in FIG. 7 and item 250 in FIG. 11) that includes a second polarity semiconductor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can include, for example, ion implantation, etc.

In item 302, these methods form a first source (shown in item 132 in FIG. 7 and item 232 in FIG. 14) and a first drain (shown in item 146 in FIG. 7 and item 246 in FIG. 14) contacting the first channel region. Note, that the source and drain regions in FIG. 14 can be formed using sacrificial (dummy) gate placeholders 222, 224, which are later replaced with the actual gate conductors, as shown in FIG. 5. Similarly, processing in item 302 forms a second source (shown in item 152 in FIG. 7 and item 252 in FIG. 14) and a second drain (shown in item 154 in FIG. 7 and item 254 in FIG. 14) contacting the second channel region.

Figure 8:
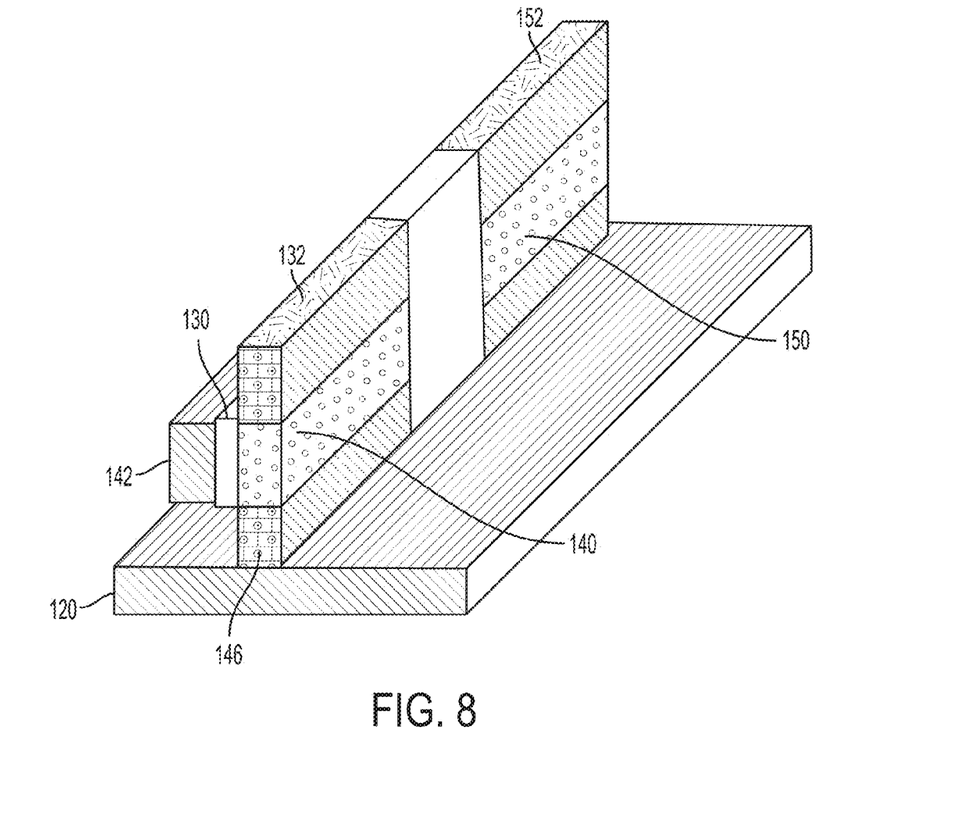
Figure 12:
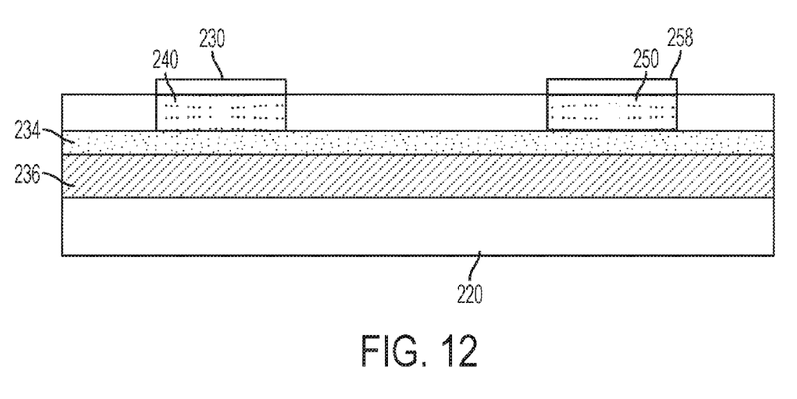
Figure 13:
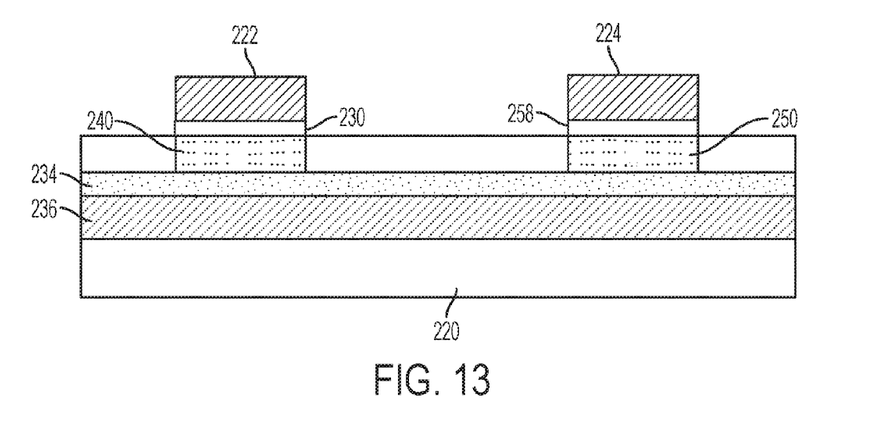

In item 304, these methods form a first gate insulator (shown in item 130 in FIG. 8 and item 230 in FIG. 12) that will separate the first gate conductor from the first channel region. The processing in item 304 also (potentially simultaneously) forms a second gate insulator (shown in item 258 in FIG. 12) that will separate the second gate conductor from the second channel region.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

Different transistor polarities discussed herein include a positive-type transistor "P-type transistor" that uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region. The different polarities cause the transistors to react in opposite manners to the same voltage input (one polarity will turn on to a low voltage input and the other polarity will turn off to the same low-voltage input, and vice versa).

Generally, transistor structures are formed by depositing or implanting impurities into a substrate to form at least one semiconductor channel region, bordered by shallow trench isolation regions below the top (upper) surface of the substrate. A "substrate" herein can include any material appropriate for the given purpose (whether now known or developed in the future) and can include, for example, Si, SiC, SiGe, SiGeC, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

In item 306, these methods form a first gate conductor (as shown in item 142 in FIG. 8 and item 242 in FIG. 5) adjacent the first channel region (on the first gate insulator), and form a second gate conductor (as shown in item 248 in FIG. 5) adjacent the second channel region (on the second gate insulator).

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Figure 9:
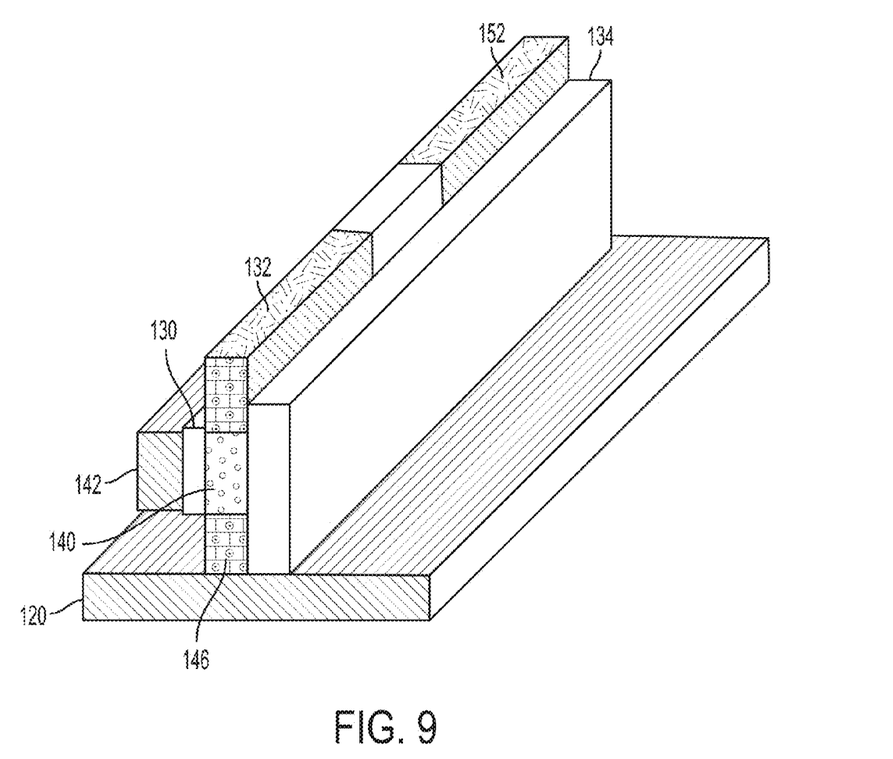

In item 308, such methods further form a first back gate insulator (as shown in item 134 in FIG. 9 and item 234 in FIG. 11) contacting the first channel region and similarly form a second back gate insulator contacting the second channel region. As can be seen in FIGS. 2-5, the first gate insulator is thinner than the first back gate insulator (in the first direction, that is from the first gate conductor to the first back gate), and the second gate insulator is similarly thinner than the second back gate insulator in the first direction.

For purposes herein, an "insulator" is a relative term that means a material or structure that allows substantially less (typically $1/1000000$ times or less) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

Figure 10:
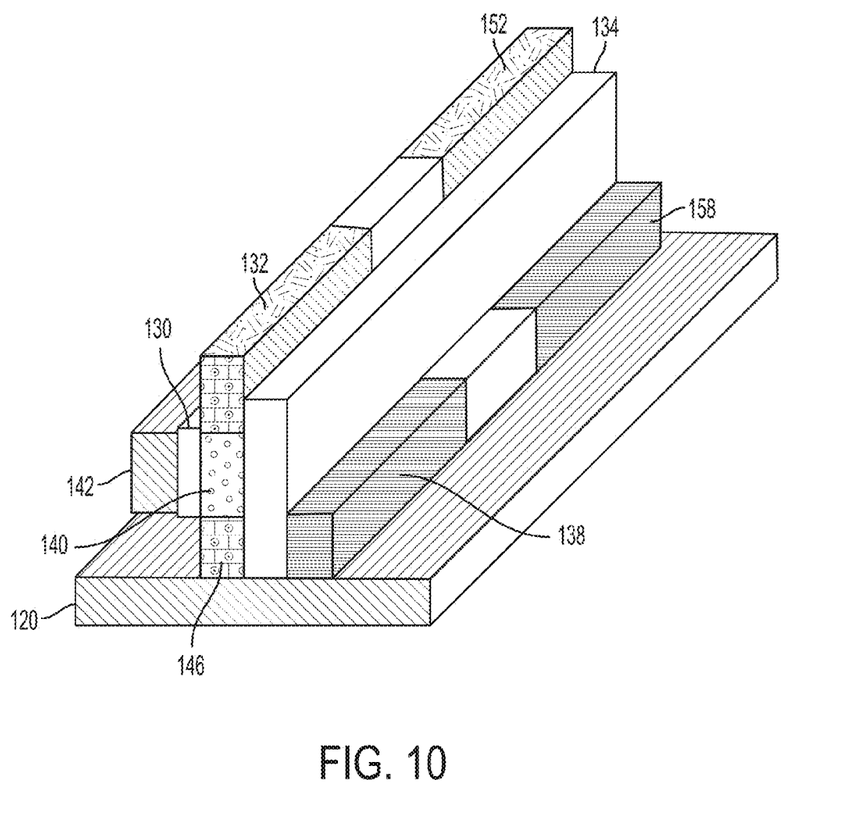
Figure 14:
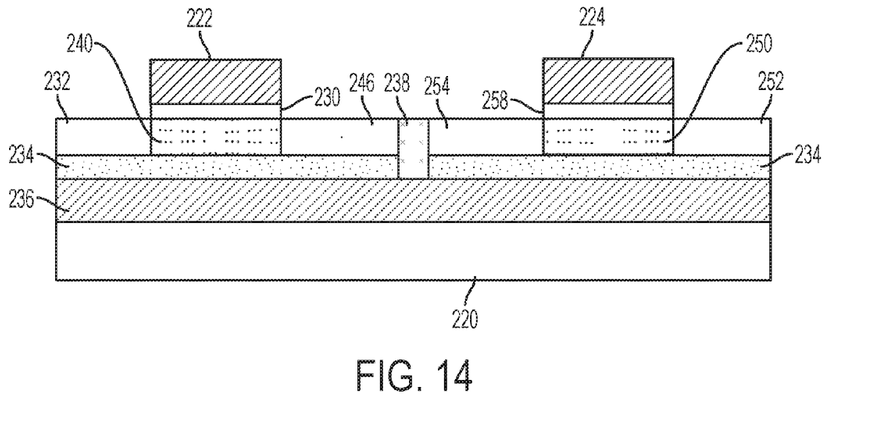

As shown in item 310 in FIG. 6, these methods additionally form a first delay element connected to the first back gate, and form a second delay element connected to the second back gate (as shown in item 138 in FIG. 10 and item 238 in FIG. 14). The first delay element is a relative "resistor" and is therefore more conductive than the first back gate insulator and less conductive that the first back gate, and the same applies to the second resistor, which is more conductive than the second back gate insulator and less conductive that the second back gate.

The resistors mentioned herein can be formed by supplying (depositing) a material having a certain conductivity (resistivity), or by selectively implanting impurities into an insulator in order to adjust the conductivity (resistivity) to the desired value. As noted above, the resistors herein are utilized to control how quickly the charge within (or threshold voltage of) the back gate dissipates (the rate of back gate charge, or threshold voltage, dissipation) after the input voltage value switches. Therefore, the resistivity of such resistors is adjusted during manufacturing (through selective doping, etc.) based upon the characteristics of the transistor and upon which resistance performance characteristics will provide an optimum rate (fast or slow) of charge dissipation from the back gate (which will vary from transistor design to transistor design).

Additionally, in item 312, such methods form a first back gate (as shown in item 136 in FIG. 2 and item 236 in FIG. 11) contacting the first back gate insulator (the first back gate is separated from the first channel region by the first back gate insulator). Processing in item 312 also forms a second back gate (as shown in item 156 in FIG. 2 and item 236 in FIG. 11) contacting the second back gate insulator (similarly, the second back gate is separated from the second channel region by the second back gate insulator) as shown in item 134 in FIG. 9 and item 236 in FIG. 11. Further, in item 314 such processing forms an input (as shown in item 120 in FIG. 2 and FIG. 5) connected to the first gate conductor and the second gate conductor. In item 314 also forms an output (as shown in item 100 in FIG. 2 and item 120 in FIG. 5) connected to the first drain and the second drain.

The first resistor, the first back gate insulator, and the first channel region are formed in the above processing to potentially create a first resistor-capacitor (RC) circuit; and, similarly, the second resistor, the second back gate insulator, and the second channel region are formed in the above processing to potentially create a second RC circuit. The first and second RC circuits delay changes in threshold voltage of the first and second transistors, and such changes (e.g., increases and decreases) in threshold voltage occur sometime after a voltage of the input changes. The changes in threshold voltage of the second transistor are decreases in threshold voltage, and the changes in threshold voltage of the first transistor are increases in threshold voltage.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then, one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise.

In the drawings herein, the same identification numeral identifies the same or similar item. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
a first transistor and a second transistor of opposite polarity; and
an output connected to the first transistor and the second transistor,
the first transistor comprising: a first channel region; a first back gate comprising a first back gate insulator adjacent to the first channel region and a first back gate conductor adjacent to the first back gate insulator opposite the first channel region; and a first delay element comprising a first resistor immediately adjacent to the first back gate insulator and further extending from immediately adjacent to the first back gate conductor to the output, and
the second transistor comprising: a second channel region; a second back gate comprising a second back gate insulator adjacent to the second channel region and a second back gate conductor adjacent to the second back gate insulator opposite the second channel region; and a second delay element comprising a second resistor immediately adjacent to the second back gate insulator and further extending from immediately adjacent to the second back gate conductor to the output.

2. The device according to claim 1,
the first delay element, the first back gate insulator, the first back gate conductor and the first channel region comprise a first resistor-capacitor (RC) circuit, and
the second delay element, the second back gate insulator, the second back gate conductor and the second channel region comprise a second RC circuit.

3. The device according to claim 2, the first RC circuit delays changes in threshold voltage of the first transistor, and the second RC circuit delays changes in threshold voltage of the second transistor, wherein changes in threshold voltage occur when a voltage of at least one of the first back gate and the second back gate changes, and the changes in threshold voltage of the second transistor are decreases in threshold voltage, and the changes in threshold voltage of the first transistor are increases in threshold voltage.

4. The device according to claim 1,
the first transistor and the second transistor being vertical transistors,
the first transistor having a first drain, the first channel region and a first source stacked vertically on the output,
the first back gate insulator being above the output and positioned laterally adjacent to the first drain and the first channel region,
the first delay element and the first back gate conductor being stacked vertically on the output such that the first back gate insulator is positioned laterally between the first drain and the first delay element and further positioned laterally between the first source and the first back gate conductor,
the second transistor having a second drain, the second channel region and a second source stacked vertically on the output,
the second back gate insulator being above the output and positioned laterally adjacent to the second drain and the second channel region, and
the second delay element and the second back gate conductor being stacked vertically on the output such that the second back gate insulator is positioned laterally between the second drain and the second delay element and further positioned laterally between the second source and the first back gate conductor.

5. The device according to claim 1,
the first transistor and the second transistor being planar transistors and the first delay element and the second delay element being a shared delay element between and immediately adjacent to a first drain of the first transistor and a second drain of the second transistor.

6. The device according to claim 1, the first transistor further comprising a first gate that comprises a first gate insulator and a first gate conductor, the first gate insulator separating the first gate conductor from the first channel region,
the first gate insulator is thinner than the first back gate insulator,
the second transistor further comprising a second gate that comprises a second gate insulator and a second gate conductor, the second gate insulator separating the second gate conductor from the second channel region, and
the second gate insulator is thinner than the second back gate insulator.

7. The device according to claim 6,
the first delay element delays an input voltage being transmitted from the first gate conductor to the first back gate by a time greater than the input voltage rise or fall time, and
the second delay element delays an input voltage being transmitted from the second gate conductor to the second back gate by a time greater than the input voltage rise or fall time.

8. A device comprising:
a first transistor having a first polarity;
a second transistor having a second polarity;
an input connected to the first transistor and the second transistor; and
an output connected to the first transistor and the second transistor,
the first transistor comprising:
a first channel region comprising a semiconductor;
a first gate and a first back gate separated by the first channel region the first back gate comprising a first back gate insulator adjacent to the first channel region and a first back gate conductor adjacent to the first back gate insulator opposite the first channel region;

a first delay element comprising a first resistor immediately adjacent to the first back gate insulator and further extending from immediately adjacent to the first back gate conductor to the output; and a first source and a first drain separated by the first channel region, the second transistor comprising:

a second channel region comprising a semiconductor;

a second gate and a second back gate separated by the second channel region, the second back gate comprising a second back gate insulator adjacent to the second channel region and a second back gate conductor adjacent to the second back gate insulator opposite the second channel region;

a second delay element comprising a second resistor immediately adjacent to the second back gate insulator and further extending from immediately adjacent to the second back gate conductor to the output;

a second back gate insulator separating the second back gate from the second channel region; and a second source and a second drain separated by the second channel region, the first gate and the second gate are connected to the input, the first drain and the second drain are connected to the output, the first source, the first drain, the second source, and the second drain comprise conductors, the first delay element, the first back gate insulator, the first back gate conductor, and the first channel region comprise a first resistor-capacitor (RC) circuit, and the second delay element, the second back gate insulator, the second back gate conductor, and the second channel region comprise a second RC circuit.

9. The device according to claim 8, the first RC circuit delays changes in threshold voltage of the first transistor, and the second RC circuit delays changes in threshold voltage of the second transistor.

10. The device according to claim 9, the changes in threshold voltage occur when a voltage of at least one of the first back gate and the second back gate changes.

11. The device according to claim 9, wherein changes in threshold voltage of the second transistor are decreases in threshold voltage, and changes in threshold voltage of the first transistor are increases in threshold voltage.

12. The device according to claim 8, the first delay element is more conductive than the first back gate insulator and less conductive that the first back gate conductor, and the second delay element is more conductive than the second back gate insulator and less conductive that the second back gate conductor.

13. The device according to claim 8, the first gate further comprises a first gate insulator and a first gate conductor, the first gate insulator separating the first gate conductor from the first channel region, the first gate insulator is thinner than the first back gate insulator in a first direction from the first gate conductor to the first back gate, the second gate further comprises a second gate insulator and a second gate conductor, the second gate insulator separating the second gate conductor from the second channel region, and the second gate insulator is thinner than the second back gate insulator in the first direction.

14. The device according to claim 13, the first delay element delays an input voltage being transmitted from the first gate conductor to the first back gate by a time greater than the input voltage rise or fall time, and the second delay element delays an input voltage being transmitted from the second gate conductor to the second back gate by a time greater than the input voltage rise or fall time.

15. A method comprising:

simultaneously forming a first transistor having a first polarity and a second transistor having a second polarity, opposite the first polarity, in a process comprising:

forming a first channel region comprising a first polarity semiconductor;

forming a second channel region comprising a second polarity semiconductor;

forming a first source and a first drain contacting the first channel region;

forming a second source and a second drain contacting the second channel region;

forming a first gate conductor adjacent the first channel region;

forming a second gate conductor adjacent the second channel region;

forming a first back gate insulator contacting the first channel region;

forming a second back gate insulator contacting the second channel region;

forming a first back gate conductor contacting the first back gate insulator, the first back gate conductor is separated from the first channel region by the first back gate insulator; and forming a second back gate conductor contacting the second back gate insulator, the second back gate conductor is separated from the second channel region by the second back gate insulator;

forming a first delay element comprising a first resistor immediately adjacent to the first back gate insulator and the first back gate conductor;

forming a second delay element comprising a second resistor immediately adjacent to the second back gate insulator and the second back gate conductor;

forming an input connected to the first gate conductor and the second gate conductor; and forming an output to the first drain and the second drain, the first delay element extending from immediately adjacent to the first back gate conductor to the output and the second delay element extending from immediately adjacent to the second back gate conductor to the output.

16. The method according to claim 15, the first delay element, the first back gate insulator, the first back gate conductor, and the first channel region comprise a first resistor-capacitor (RC) circuit, and the second delay element, the second back gate insulator, the second back gate conductor, and the second channel region comprise a second RC circuit.

17. The method according to claim 16, the first RC circuit delays changes in threshold voltage of the first transistor, and the second RC circuit delays changes in threshold voltage of the second transistor.

18. The method according to claim 17, the wherein changes in threshold voltage occur when a voltage of at least one of the first back gate and the second back gate changes.

19. The method according to claim 17, wherein changes in threshold voltage of the second transistor are decreases in threshold voltage, and changes in threshold of the first transistor are increases in threshold voltage.

20. The method according to claim 15, further comprising:
- forming a first gate insulator separating the first gate conductor from the first channel region, the first gate insulator is thinner than the first back gate insulator in a first direction from the first gate conductor to the first back gate; and
- forming a second gate insulator separating the second gate conductor from the second channel region, the second gate insulator is thinner than the second back gate insulator in the first direction.

* * * * *